(12) United States Patent
Han et al.

(10) Patent No.: US 8,631,420 B2
(45) Date of Patent: Jan. 14, 2014

(54) ELECTONIC PROCESSING OF CONTEXT-AWARE BUSINESS EVENTS

(75) Inventors: Qiang Han, Ashtown (IE); Mark McSherry, Boardsmill (IE); Antonio Rigon, Ashtown (IE); Donal Tobin, Ranelagh (IE)

(73) Assignee: Business Objects Software Ltd., Dublin (IE)

( * ) Notice: Subject to any disclaimer, the term of this patent is extended or adjusted under 35 U.S.C. 154(b) by 120 days.

(21) Appl. No.: 13/271,263

(22) Filed: Oct. 12, 2011

(65) Prior Publication Data

US 2013/0097618 A1 Apr. 18, 2013

(51) Int. Cl.
*G06F 9/44* (2006.01)
*G06Q 40/00* (2012.01)

(52) U.S. Cl.
USPC .......................................... 719/318; 705/42

(58) Field of Classification Search
None
See application file for complete search history.

(56) References Cited

U.S. PATENT DOCUMENTS

| | | | |
|---|---|---|---|
| 8,239,880 B1* | 8/2012 | Caccavale et al. | 719/318 |
| 2007/0027806 A1* | 2/2007 | Sands et al. | 705/42 |
| 2008/0189170 A1* | 8/2008 | Ramachandra | 705/10 |

OTHER PUBLICATIONS

Carlos Rodriguez et al "Computing Uncertain Key Indicators From Uncertain Data", 2009.*

* cited by examiner

*Primary Examiner* — Lechi Truong
*Assistant Examiner* — Abdou Seye

(57) ABSTRACT

Various embodiments of systems and methods for electronic processing of context-aware business events are described. According to one aspect, business events are enriched with more business semantics by encapsulating business contexts that define the events' producing environment. The produced context-aware events include a structure of context items describing with system and application parameters the producing environment when the events originally happened. During reconstruction of the structure of context items, the contextual business information is retrieved and can be included in the business events to provide the event consumer with more information about the business event.

17 Claims, 10 Drawing Sheets

```xml
<n:payload xmlns:n="http://xml.sap.com/2010/03/sbc/en/notification">
        <n:messages default="en" timestamp='72682917289'>
                <!-- Message Body --!>
        </n:messages>
<n:context>

<n:ContextItem type='dimension'>
    <n:name>Product</ctx:name>
    <n:datasource>Fiancial Planning</n:datasource>
    <n:member>Auto Industry</n:member>
  </n:ContextItem>

<n:ContextItem type='dimension'>
    <n:name>Period</ctx:name>
    <n:datasource>Fiancial Planning</n:datasource>
    <n:member>Q1.2009</n:member>
  </n:ContextItem>

<n:ContextItem type='KPI'>
      <n:name>Profit KPI</ctx:name>
      <n:datasource>Fiancial Planning</n:datasource>
      <n:value>20,000</n:value>
  </n:ContextItem>

<!-- more context items go here --!>

</n:context>
</n:payload>
```

FIGURE 2

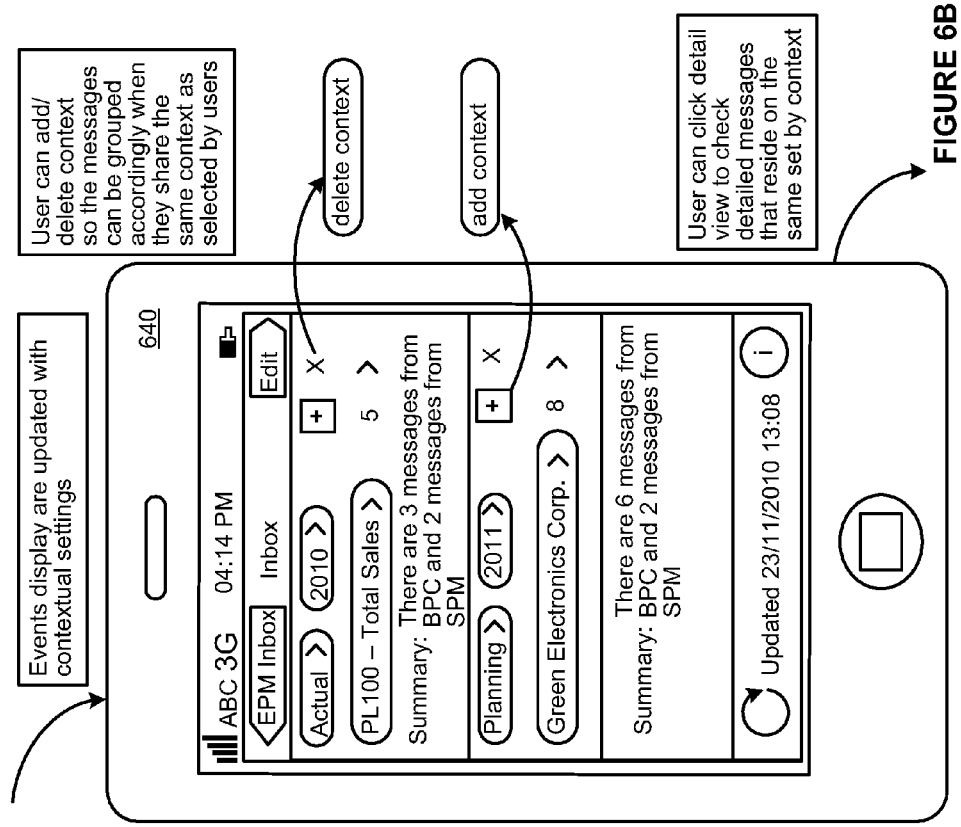
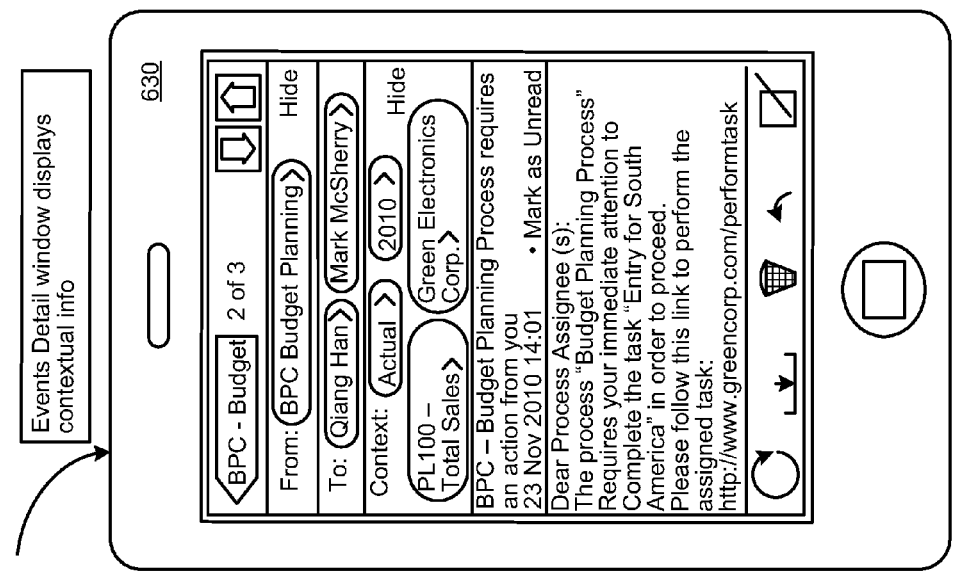
FIGURE 6B

ELECTONIC PROCESSING OF CONTEXT-AWARE BUSINESS EVENTS

FIELD

The field generally relates to the software arts, and, more specifically, to methods and systems for electronic processing of context-aware business events.

BACKGROUND

In computing, context awareness is related to the idea that the computers can be programmed to be aware of and react to their environment, or the environment of their users. Computing devices may have information about the circumstances under which they are able to operate and based on some rules, for example, can react accordingly. Context-aware devices may also try to make assumptions about the user's current situation. A context can be defined as any information that can be used to characterize the situation of an entity. Context-aware systems concern acquisition of a context (e.g., using sensors to perceive a situation), the abstraction and understanding of a context (e.g., matching a perceived sensory stimulus to a context), and application behavior based on the recognized context (e.g., triggering actions based on context).

Business applications today increasingly demand a sophisticated event framework to allow data being exchanged in real-time and asynchronous style. Even though many popular messaging framework implementations (such as standard JMS, ActiveMQ, IBM MQ, and so on) exist and message-oriented integration patterns (such as SOA, ESB, OSGI, etc.) are widely applied in practice, there is still a lack of effective models that allow events to be more consumable for end users. Many messages are effective for machine consumption but are difficult for a non-technical person to comprehend. Most events are generated by machines based on some business logic. Typically, events are produced close to source codes, but consumed close to human beings. This leads to gaps between event generation and consumption. Further, information carried by events is normally concise and abstract. It requires more information (i.e., context) to understand what has actually happened, especially when users read them in completely different setups (e.g., time, domain). Events are normally delivered to users and considered as an end node of the process. The next natural step is for users to investigate events and take actions. However, systems today do not provide users any information or navigation to start the investigations or take actions. The user has to depend on previous knowledge of the system.

SUMMARY

Various embodiments of systems and methods for electronic processing of context-aware business events are described herein. In various embodiments, the method includes receiving a context-aware event comprising an event and a context associated with the event, wherein the context comprises a structural description of an environment in which the event was generated. The associated context is retrieved from the context-aware event. Then, the context associated with the event is reconstructed in order to reconstruct the environment of the event when the event was generated. Finally, context business information extracted from the reconstructed environment is provided in an enriched event.

In various embodiments, the system includes a processor and a memory in communication with the processor. According to one aspect, the memory includes an event consumption environment that receives a context-aware event that comprises a structural description of an environment in which the event was generated. The memory also includes at least one functional module in the event consumption environment that retrieves the context associated with the event from the context-aware event and reconstructs the context attached to the event to reconstruct the environment of the event when the event was produced. Additionally, an event consumer application is included that receives an enriched event with context business information extracted from the reconstructed environment.

These and other benefits and features of embodiments of the invention will be apparent upon consideration of the following detailed description of preferred embodiments thereof, presented in connection with the following drawings.

BRIEF DESCRIPTION OF THE DRAWINGS

The claims set forth the embodiments of the invention with particularity. The invention is illustrated by way of example and not by way of limitation in the figures of the accompanying drawings in which like references indicate similar elements. The embodiments of the invention, together with its advantages, may be best understood from the following detailed description taken in conjunction with the accompanying drawings.

FIG. 2 is a block diagram illustrating an example of a code snippet of the context of an event.

FIGS. 6A, 6B, and 6C represent an example illustrating the steps of consuming context-aware events from a mobile application.

DETAILED DESCRIPTION

Embodiments of techniques for systems and methods for electronic processing of context-aware business events are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment", "this embodiment" and similar phrases, means that a particular feature, structure, or characteristic described in connection with the embodiment is included in at least one embodiment of the present invention. Thus, the appearances of these phrases in various places throughout this specification are not necessarily all referring to the same embodiment. Furthermore, the particular features, structures, or characteristics may be combined in any suitable manner in one or more embodiment.

In various embodiments, methods and systems provide solution that extends the ultimate user experiences of consuming events and also offers a new perspective on how events can be effectively produced for a better consumption. A context-aware event is like a time capsule that does not only capture what happened to an event (e.g., event bodies), but also the environment in which the event took place. The environment in which the event took place is described in the context of the context-aware event. The context of the event is an abstraction of the environment when the event was produced. In a simple scenario, the environment is described by a set of extra dimensions such as system parameters and application parameters added to the classic events and thus generating context-aware events which contexts describe the situation (i.e., environment) that triggers the event. This can be beneficial when users try to reconstruct what has happened to the event by reconstructing the context, and hence the environment, of the event during consumption of the context-aware event. Even though there may be timestamps or even locations encoded in most events/messages generated today, there is no effective mechanism that leads to producing a comprehensive view of the scenario. This becomes particularly true when events are business oriented.

Figure 1:
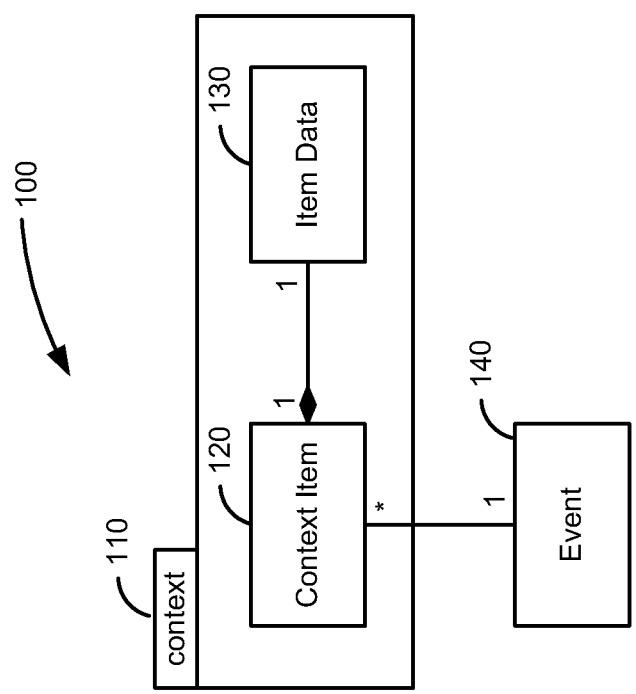
FIG. 1 is a block diagram illustrating a model structure of a context-aware event.

FIG. 1 is a block diagram illustrating a model structure of a context-aware event. Usually, an event in a system is triggered by an event trigger. The event trigger registers an action, or state such as a given date and time, or a business condition and then triggers the event. The event may be a message, an action, a request, a query, and so on. In various embodiments, a business condition can be created as a query with a certain outcome and when that query is satisfied, an event could be triggered and generated. The query may require some system parameters or application parameters to be populated in the query. When the query is populated, i.e. satisfied, with the required system parameters or application parameters, the event is triggered and generated. The system parameters or the application parameters are provided by the system or application before the event is triggered. The generated event would describe what has happened in the system. The event would include the system parameters or the application parameters in a structured way that describe the environment of the event in a generalized way.

In various embodiments, this structured description including the system parameters or the application parameters is the context of the event. Model 100 illustrates the context 110 of an event 140. Context 110 includes a set of context items such as context item 120. The context items represent the system parameters or the application parameters. For example, the context of an event can be represented as a table structure, where each row in the table represents a context item with corresponding data. Context item 120 is a data element (a parameter) that encapsulates various metadata such as item data 130 and offers a unified data interface. Item data 130 is a data element that includes a set of data describing context item 120. For example, context item 120 is an application parameter of type "employee" and item data 130 includes data "John Adams", "sales and marketing", "6 years" describing the parameter type "employee" with data such as name, organizational unit, and years worked in the company. The context item 120 and the item data 130 form a structural representation of the context 110 of event 140.

FIG. 2 is a block diagram illustrating an example of a code snippet of the context of an event. In various embodiments, the context of the event is included in the event itself. In code snippet 200, the event is a message and the context of the event is included in the message body of the message. The context of the event is described structurally including a set of context items, where a context item of the set of context items includes a set of item data describing the context item. For example, code snippet 200 includes a context item of type "dimension", a context item of type "KPI", and so on. A context item of type "dimension" means that the context item is of type "dimension" and it can be described in various ways by different item data. The context item may be an application parameter or system parameter. For example, the context item of type "dimension" is described with a first set of item data including "product", "financial planning", and "auto industry" that describes the name, the data source, and the member data of the context item of type "dimension". A second set of item data, "period", "financial planning", and "Q1.2009", provides another description of context item of type "dimension" by defining different data values for the name, the data source, and the member data of the context item of type "dimension".

As mentioned, the context of the event (the context items and item data) is an abstraction of the environment when the event was produced. In the current example, the set of item data, "product", "financial planning", and "auto industry" describes the environment of the event, this is, the event concerns a product in the financial planning area and more specifically the auto industry.

Further, another context item is included in code snippet 200. Context item of type "KPI" is described in the context of the event. Context item of type "KPI" is described with a set of item data including "profit KPI", "financial planning", and "20,000" that describes the name, the data source, and the value data of the context item of type "KPI". The context of the event, included in the message body of the message, may include a plurality of context items of different types, which organized structurally with their item data would describe the context of the event.

Figure 3:
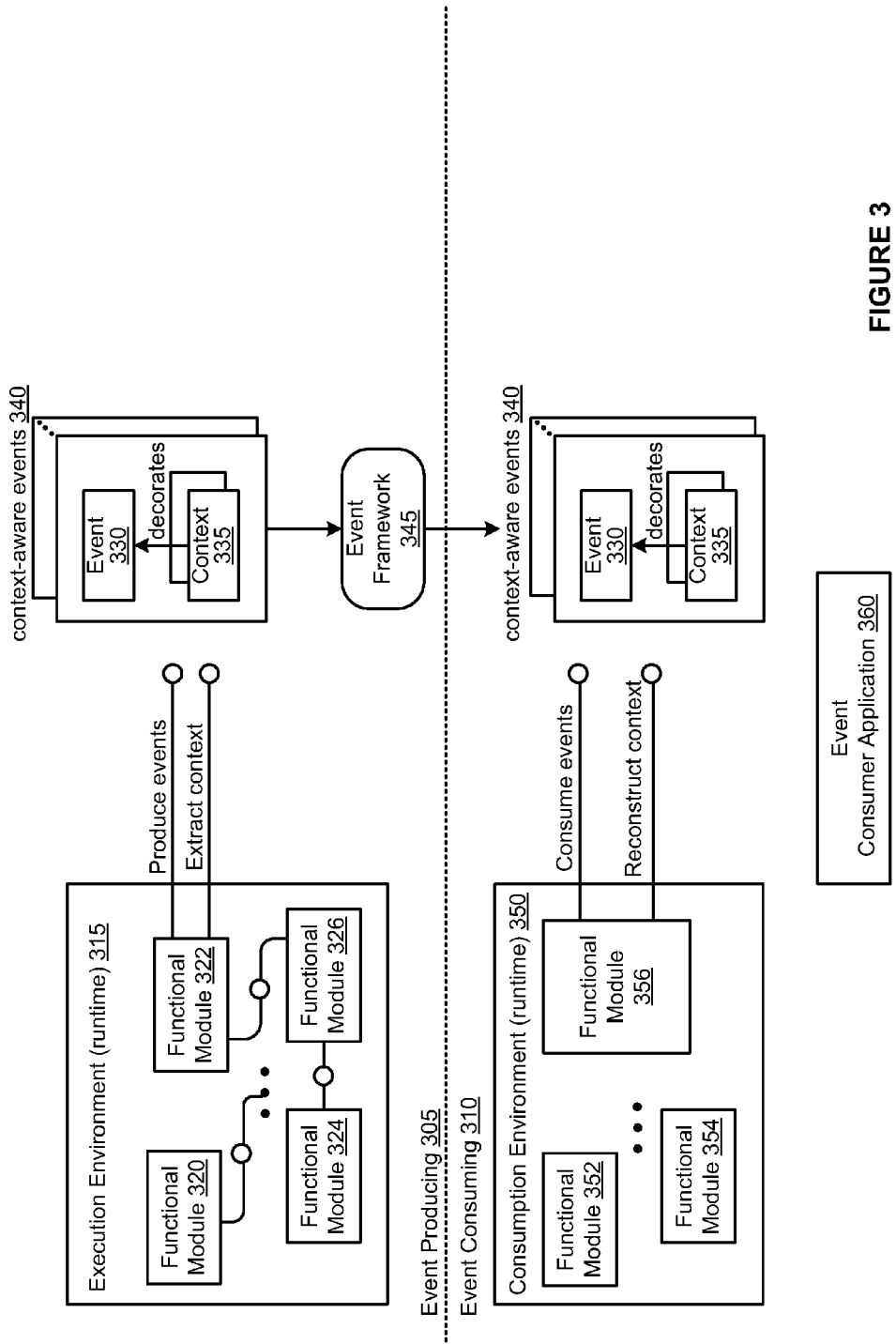
FIG. 3 is a block diagram illustrating an architectural view of the components involved in producing and consuming context-aware events.

FIG. 3 is a block diagram illustrating an architectural view of the components involved in producing and consuming context-aware events. In various embodiments, there are two phases included in the process of producing and consuming context-aware events. Phase one is event producing 305 and phase two is event consuming 310. Event producing phase 305 includes components and methods for producing context-aware events in a system or an application. Event consuming phase 310 includes the components and methods for consuming the produced context-aware events by a processing engine or the application. Event producing phase 305 includes an execution environment 315, which is a runtime environment of a system that produces events. More specifically, these events are produced by the set of functional modules (e.g., functional modules 320, 322, 324, 326) included in the execution environment 315.

When an event 330 happens in the system, the functional modules are the components that generate and produce the events. In various embodiments, the functional modules use application programming interfaces (APIs) to extract the context 335 of the event 330, when the event 330 occurred, during the generation of the context-aware events 340. The extracted context 335 includes a set of system parameters or application parameters, or a combination of system and application parameters that describe the context of the occurred event 330. The extracted context 335 is associated with the body of the event 330 and thus generates the context-aware event 340. In some embodiments, the event 330 may be a message and in that case the extracted context 335 is attached to the message body of the message. In event producing phase 305, events are produced from the functional modules of the execution environment 315, their contexts are extracted and attached to the bodies of the events generating context aware events. The context-aware events are handled by event framework 345.

The event framework 345 provides the context-aware events to the consumption environment 350 for consumption.

Event consuming phase 310 includes the components and methods for consuming the context-aware events produced by a processing engine or the application. Event consuming phase 310 includes a consumption environment 350, which is a runtime environment of a system that consumes the context-aware events. The consumption environment 350 includes a set of user interfaces, APIs, and a set of functional modules, such as functional modules 352, 354, 356, that consume the context-aware events. In some embodiments, the consumption of the context-aware events may be performed by a process engine as part of a process such as a workflow that may trigger other workflows. In other embodiments, the consumption of the context-aware events is performed first by the application receiving the context-aware events (e.g., event consumer application 360) and then optionally by users of the system. For example, a message (e.g., event) is sent to an e-mail managing program. The message includes context-aware information in the message body, meaning that the message body provides information about the occurred event. This information can be presented as text, graphical images, additional links, attached playable videos, and so on. In some scenarios, the e-mail managing program can scan the message body, retrieve the context information of the message and based on the context information may decide to forward the message to other recipients, to move it to a specific folder (e.g., based on some predefined rules), or perform some other task. Thus, the e-mail managing program will trigger another process in the system to perform the task and may produce another context-aware event. In other embodiments, the e-mail managing program may simply put the message in the inbox and let the recipient of the message look at the message personally and retrieve context information if needed. Some of the context information may be fully presented in the message body and some of the context information may be included as clickable links, attached documents and files, and so on. The recipient may decide if he or she wants to retrieve further context information about the message by clicking the links, opening the attached files, and so on.

In various embodiments, providing and presenting the context information included in an event involves reconstructing the context. The reconstruction of the context is performed by the functional modules of the consumption environment 350. The event framework 345 provides the context-aware events to the consumption environment 350, where the functional modules (e.g., the e-mail managing program) reconstruct the context of the event to retrieve the business information (e.g., context environment data) captured when the event occurred. This information is then presented to the user for better understanding of the occurred event and for possible decision making.

Figure 4A:
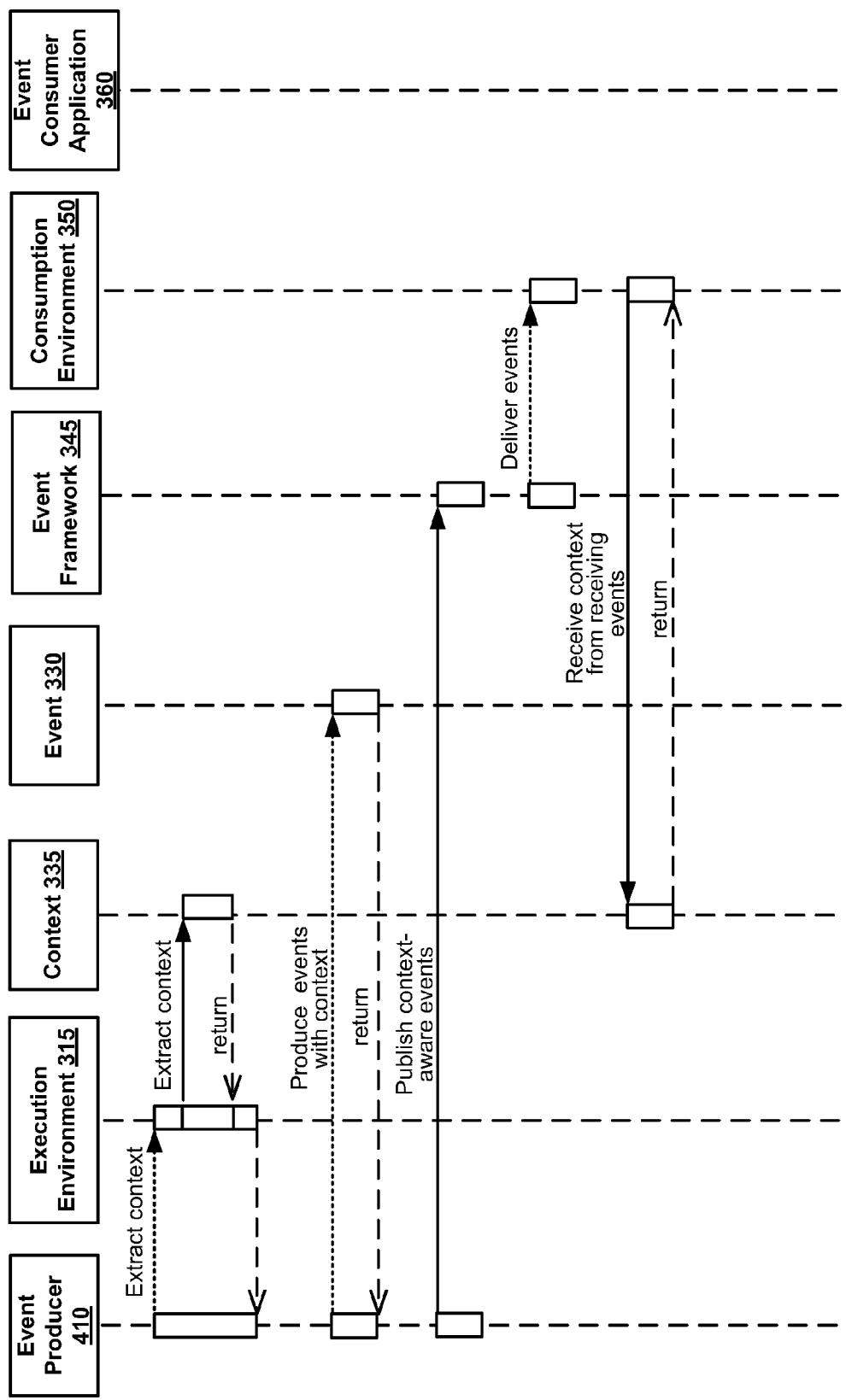
FIGS. 4A and 4B represent a sequence diagram illustrating the steps of producing and consuming context-aware events.
Figure 4B:
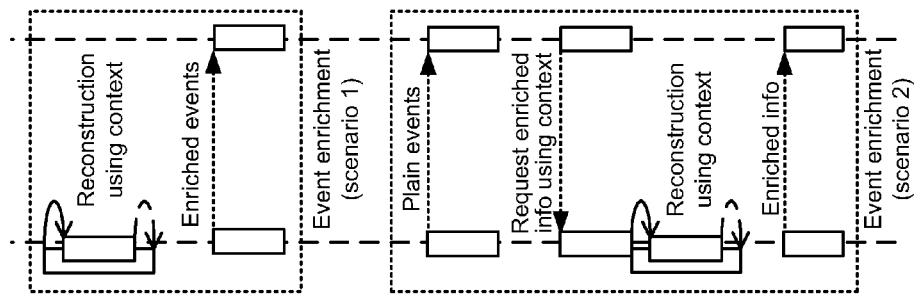

FIGS. 4A and 4B represent a sequence diagram illustrating the steps of producing and consuming context-aware events. The context of the event is an abstraction of the environment when the event was produced. The objective of context abstraction is to enable event consuming to reconstruct the past, i.e. the producing environment of the event. As a result, many services can be derived during the reconstruction. For example, additional information can be collected and retrieved to help users build up a better understanding about the environment in which the event occurs when investigating the event.

In various embodiments, event producer 410 (e.g., functional module 320) sends a request to the execution environment 315 to extract the business context information (or just "context") of the system and application environment when an event is produced. The context includes business information structured semantically in a set of context items with a set of item data. The structured context represents the system parameters and the application parameters of the system and the application environment when the event is produced. The execution environment 315 extracts the context 335 and returns it to the event producer 410. The event producer 410 generates a context-aware event based on the occurred event 330 and the extracted context attached to the occurred event. Then, the event producer 410 publishes the generated context-aware event to the event framework 345.

For example, a new employee is hired in a company. New employee business data such as contact information, position, department, picture, and so on is received in a human resources (HR) system. The HR system includes a set of APIs, user interfaces, applications, functional modules, and so on. The received business information may trigger an event in the HR system to create and entry in the system for the new employee. The functional modules of the HR system will then extract the business information that forms the environment of the event, will generate a context for the event, a structure of parameters that describe the business information, attach that generated context to the event and thus will produce a context-aware event.

The event framework 345 delivers the context-aware event to the consumption environment 350. In that way, the consumption environment 350 retrieves the context 335 of the event 330. The functional modules of the consumption environment 350 (e.g. functional module 352) reconstruct the context 335 of the received context-aware event. Reconstructing the context 335 of the context aware event means to retrieve the structure of the context and its components, these are, the context items and the item data describing the business information of context 335. Depending on the needs and requirements of the functional modules of the consumption environment 350, the whole structure or just some parts of the structure can be reconstructed. The context of the event is uniquely identified, thus the full context can be reconstructed at any later stage, that is, it depends on the consumption strategy of the event when to expand the context and how much to add to it. Once the context identifier is kept, then this can be a number of times and add more extensive information as required.

In some embodiments, the consumption environment 350 may reconstruct at least a portion of the structure of the context and include the retrieved business information from the context in an enriched event and send it to the event consumer application 360. Following the example above with the HR system and the new employee, the HR system may receive a request to send an e-mail to all employees in the company and notify them about the new colleague. The HR system will retrieve the context with the structured business information stored about the new employee. The functional modules of the HR system will reconstruct the context to get the structure including the business information such as contact information, position, department, picture, and so on. Then, the functional modules will send an enriched e-mail including the retrieved data from the reconstructed structure of the context.

In other embodiments, the consumption environment 350 may reconstruct at least a portion of the structure of the context, include it in an enriched event, and provide the event consumer application 360 with an option to further request additional context business information. In that case, upon an additional request, the consumption environment 350 will reconstruct a second portion of the structure of the context including additional context items and item data and will provide that second portion of the structure to the event consumer application 360. In the example described above this means that the e-mail message that the HR system will send to all employees of the company will include just some data of the new employee such as name and e-mail address and will also include some links for additional information if needed. When a user clicks on a link in that e-mail, the messaging system will request this additional information from the HR system. The HR system will further reconstruct the context of the business information and provide the requested data.

Figure 5:
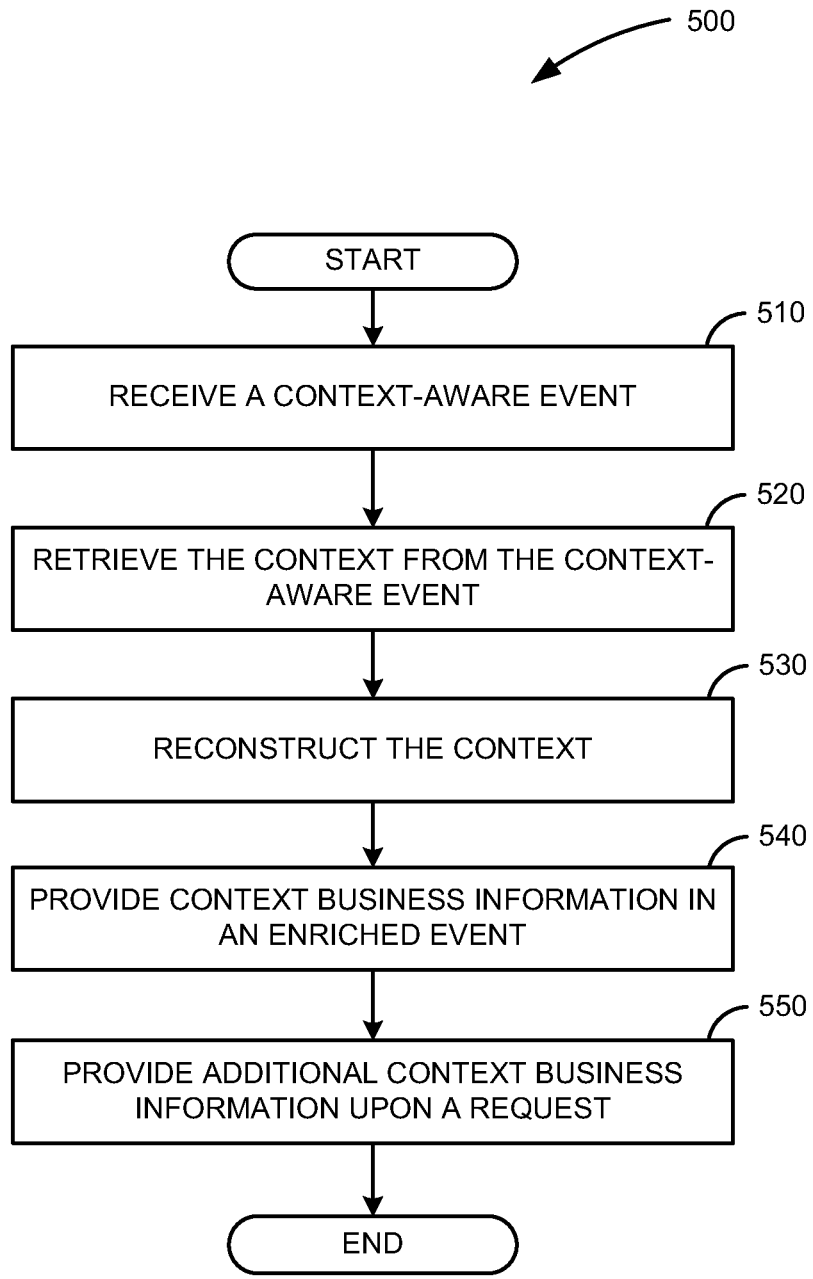
FIG. 5 is a flow diagram illustrating the steps of consuming context-aware events.

FIG. 5 is a flow diagram illustrating the steps of consuming context-aware events. In a typical business process, an event is often used to notify users on the following: 1) process status—once the status is changed, the owner of the process is notified; 2) activity assignment and reminder—an event will be sent to the assignee of a task, once it is applied; and 3) activity status—an event will be sent to notify the process owner of any changes to the activity status. When the above events are produced, the typical business process will report when and what has happened to users without any extra information. This experience is similar for most users when receiving a system generated notification/event. Such an event is abstract and quite often difficult to understand. In most cases, events are received in chronological order. Among those events, many of them may describe the very same business scenario (e.g., a planning process), but being separated by other events due to different time of receiving. A simple aggregation of those events using their business dimensions rather than a time dimension or sending detailed information will be much more powerful for a user to understand the business context by looking both at the past and the current data in a semantically cohesive way. This becomes even clearer if users are working on different tasks when a certain message comes in that requires the user to build up the scenario around the message and understand what has happened and then decide how to proceed.

A normal workflow includes the following acts: 1) investigate the event; 2) collect related information to help understand what has happened, find related documents, perform some application actions, or contact the related parties for more information, and sometimes just simply check if anything has happened in the past related to this event; 3) repeat Act 2 until the background of the event is clarified and fully analyzed; and 4) based on the collected information and analysis, make a decision on how to proceed. In various embodiments, an improved workflow includes the following steps: 1) investigate the event; 2) use the context built in the event to collect related business information; and 3) evaluate the related business information promoted by the application to make the appropriate decisions.

Process 500 illustrates the steps of the method for consuming context-aware events. At block 510, a context-aware event is received at the event consumption environment. The context-aware event includes an event that has already with an attached context that structurally describes the environment in which the event happened. In various embodiments, the context includes a structure of a set of context items, where a context item includes at least one item data. The context items represent system and application parameters of the environment when the event happened. The context-aware event is delivered from the event framework 345 to the consumption environment 350, where the context-aware event is consumed. At block 520, the context is retrieved from the context-aware event by the functional modules of the consumption environment 350.

At block 530, the retrieved context is reconstructed. The reconstruction of the context represents reconstructing the environment in which the event was produced. In response to reconstructing the context of the event, the structure of the set of context items and item data is obtained. This structure describes the context business information (the system and application parameters) of the producing environment of the event. At block 540, at least a portion of the context business information is provided in the body part of an enriched event to the event consumer application 360. At block 550, related additional context business information is provided upon a request from the event consumer application 360. When the enriched event is delivered to event consumer application 360 for consumption, the enriched information (supported by context) can be pulled from the system to provide extra data. For example, related files, documents can be obtained when the event consumer s are browsing the content of the events. In various embodiments, the additional context business information may be provided directly in the body of the same enriched event or in another enriched event body.

Figure 6A:
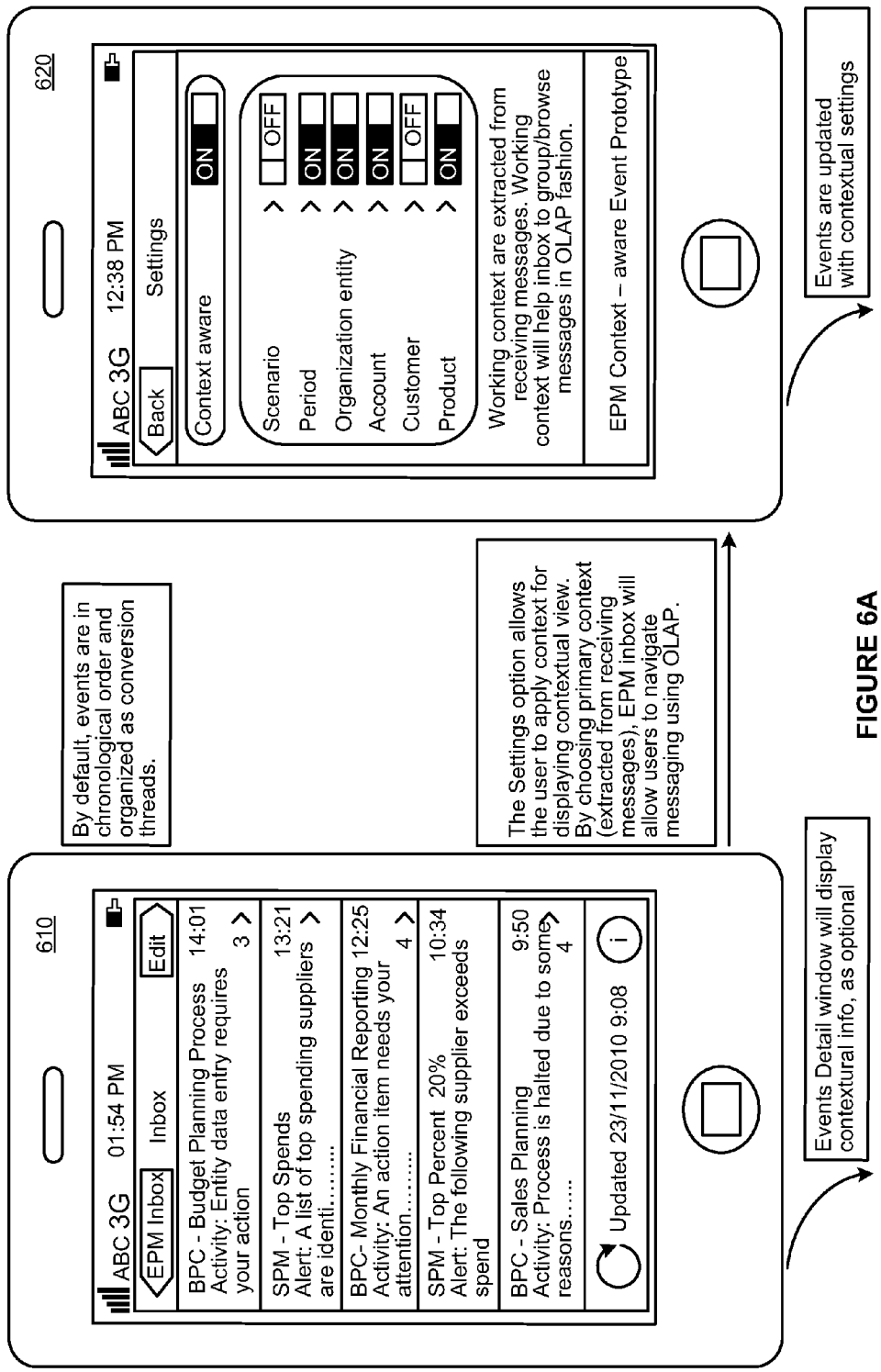
Figure 6C:
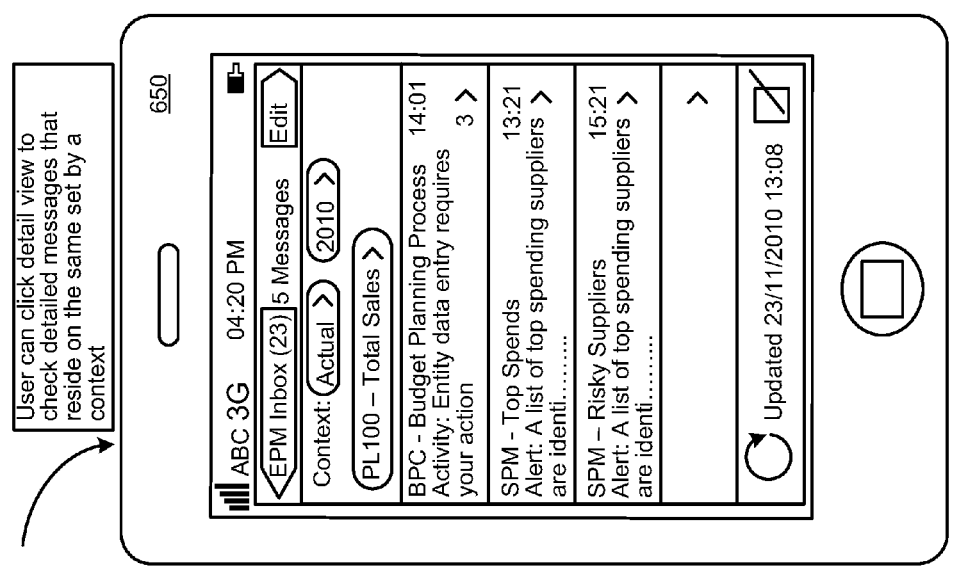

FIGS. 6A, 6B, and 6C represent an example illustrating the steps of consuming context-aware events from a mobile application. In various embodiments, the context in the context-aware events appear transparent to end users in most of the cases. The example shows a mobile device as an end consuming device that illustrates how business context can help end users quickly build semantics out of receiving events empowered by context. The mobile device includes a running mobile application Enterprise Performance Management (EPM) Inbox from SAP AG, based in Waldorf, Germany, that receives alerts from other applications, for example BusinessObjects Planning and Consolidation (BPC) and Spend Performance Management (SPM) applications, available from SAP AG. These two applications are both built on top of a business warehouse (BW) platform, and share some common dimensions such as customers, product, time, etc. In a typical inbox application, events coming from two different applications are very hard to be linked to each other. Even for events from the very same application are difficult to be aggregated using meaningful business semantics. They are quite limited to be sorted or filtered by common properties such as time, sender, title, priority, which any event may have, regardless if they are business oriented or not.

FIG. 6A, screen 610, illustrates the EPM Inbox application including a set of messages such as alerts and tasks from the BPC and SPM applications. For example, "BPC—Monthly Financial Reporting, Activity: An action item requires your attention" describes that a message (event) is received at the inbox from the BPC application's Monthly Financial Reporting area. The subject of the message includes the type of the task (e.g., activity) that the user needs to perform and a short description (e.g., "An action item requires your attention"). In various embodiments, the events are listed in chronological order and organized as conversion threads. The Settings option of the mobile application allows the user to apply a context option for displaying contextual view for the messages. By choosing switching on the "context aware" option in screen 620, the EPM Inbox application allows users to navigate messaging using Online Analytical Processing (OLAP) technology. The OLAP technology enables users to interactively analyze multidimensional data from multiple perspectives. The working contexts are extracted from the receiving messages. Depending on the mobile application functionality, the user may select what context business information to be included in the messages (events). For example, the EPM Inbox application provides option for including scenario, period, organizational entity, account, customer, product information, and so on for the messages. This information can be extracted from the context of the messages during reconstruction of the context by the application.

FIG. 6B illustrates the messages listed in the inbox of FIG. 6A displayed with the selected contextual business information. Screen 630 displays the details of a selected message. The details include the extracted context business information corresponding to the selected options in screen 620. Messages that share the same context can be grouped together. For example, messages from the same business area such as messages from the BPC application or messages from the SPM application. The user can add or delete a context so the messages can be grouped accordingly when they share the same context. When the messages are grouped in the same set by a context, the user can select to view the detailed messages in that set. Screen 640 may include a summary screen element that describes how many messages there are from a given business area (e.g., context). For example, "There are 3 messages from BPC and 2 messages from SPM". Upon a request from the user, the mobile application can list some details for the grouped messages that reside on the same set of messages by a context.

FIG. 6C and screen 650 list detailed messages for the grouped messages of a context. For example, screen 650 lists detailed messages for the grouped messages of screen 640 that "There are 3 messages from BPC and 2 messages from SPM". Screen 640 lists the detailed messages with some short description for the grouped messages. In various embodiments, besides listing the number of messages grouped by the same context, the messages can be further sorted and grouped by a business area in that context. For example, "BPC—Budget Planning Process" includes the messages from the BPC application and from the Budget Planning Process area. The mobile application displays a short description of the first message and also lists the number of messages that are grouped in the same context. The mobile application also includes two messages from the SPM application. Although these two messages are from the SPM application, they are not grouped by the same context as they are received from different areas in the SPM application. The two messages are also listed with short description providing some details for the messages.

In various embodiments, business events can be enriched with more business semantics by encapsulating business context that defines the events' triggering environment. Context-aware events enable business events to be consumed in an enhanced user consumption mode. Users are able to explore events by navigating the context such as OLAP dimensions and members. Context-aware events can be presented and analyzed using different dimensions (such as, time, priority, etc.) by leveraging the real business semantics that are captured by the contexts of the events.

Some embodiments of the invention may include the above-described methods being written as one or more software components. These components, and the functionality associated with each, may be used by client, server, distributed, or peer computer systems. These components may be written in a computer language corresponding to one or more programming languages such as, functional, declarative, procedural, object-oriented, lower level languages and the like. They may be linked to other components via various application programming interfaces and then compiled into one complete application for a server or a client. Alternatively, the components maybe implemented in server and client applications. Further, these components may be linked together via various distributed programming protocols. Some example embodiments of the invention may include remote procedure calls being used to implement one or more of these components across a distributed programming environment. For example, a logic level may reside on a first computer system that is remotely located from a second computer system containing an interface level (e.g., a graphical user interface). These first and second computer systems can be configured in a server-client, peer-to-peer, or some other configuration. The clients can vary in complexity from mobile and handheld devices, to thin clients and on to thick clients or even other servers.

The above-illustrated software components are tangibly stored on a computer readable storage medium as instructions. The term "computer readable storage medium" should be taken to include a single medium or multiple media that stores one or more sets of instructions. The term "computer readable storage medium" should be taken to include any physical article that is capable of undergoing a set of physical changes to physically store, encode, or otherwise carry a set of instructions for execution by a computer system which causes the computer system to perform any of the methods or process steps described, represented, or illustrated herein. A computer readable storage medium may be non-transitory computer readable storage medium. Examples of non-transitory computer readable storage media include, but are not limited to: magnetic media, such as hard disks, floppy disks, and magnetic tape; optical media such as CD-ROMs, DVDs and holographic devices; magneto-optical media; and hardware devices that are specially configured to store and execute, such as application-specific integrated circuits ("ASICs"), programmable logic devices ("PLDs") and ROM and RAM devices. Examples of computer readable instructions include machine code, such as produced by a compiler, and files containing higher-level code that are executed by a computer using an interpreter. For example, an embodiment of the invention may be implemented using Java, C++, or other object-oriented programming language and development tools. Another embodiment of the invention may be implemented in hard-wired circuitry in place of, or in combination with machine readable software instructions.

Figure 7:
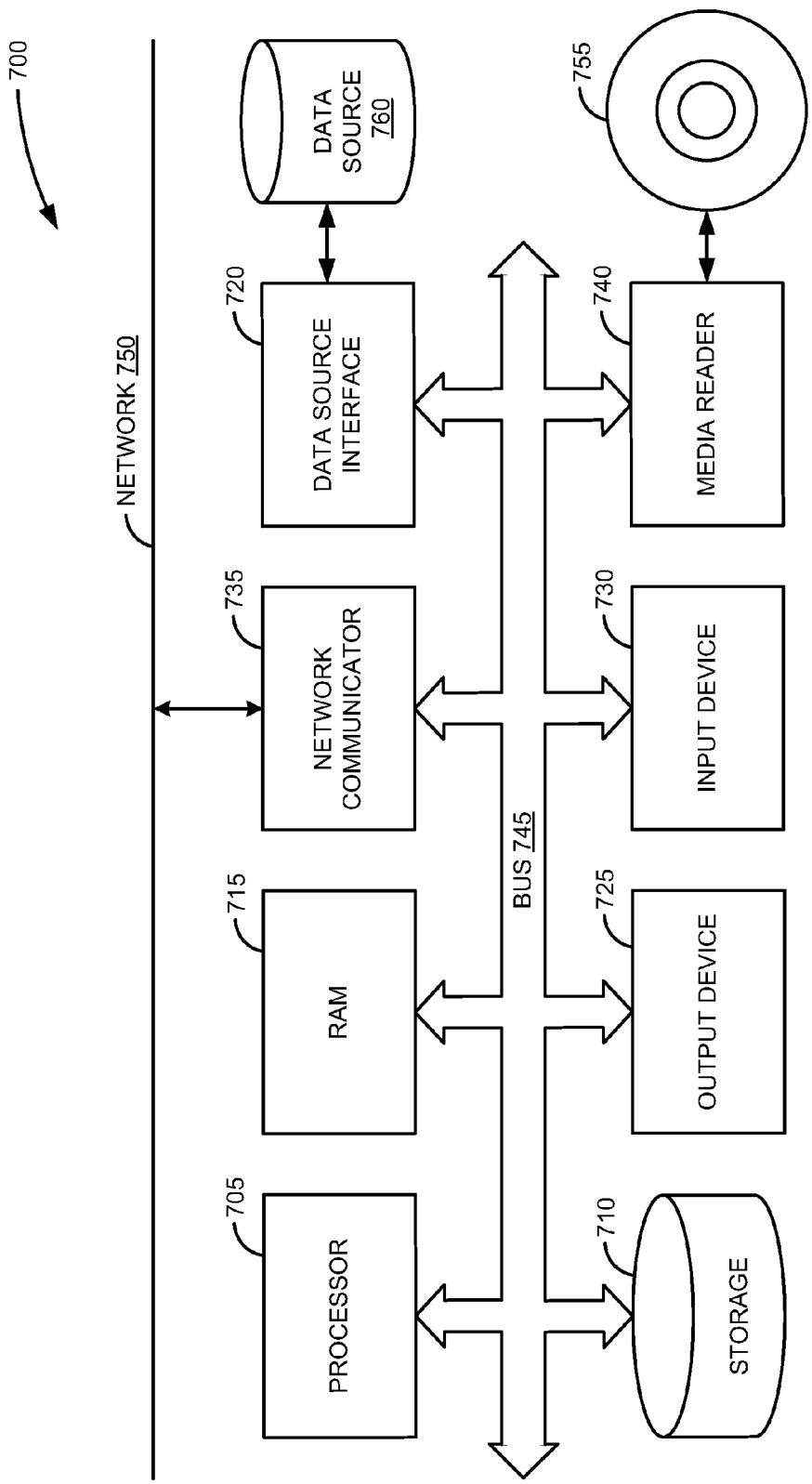
FIG. 7 is a block diagram illustrating an exemplary computer system.

FIG. 7 is a block diagram illustrating an exemplary computer system 700. The computer system 700 includes a processor 705 that executes software instructions or code stored on a computer readable storage medium 755 to perform the above-illustrated methods of the invention. The computer system 700 includes a media reader 740 to read the instructions from the computer readable storage medium 755 and store the instructions in storage 710 or in random access memory (RAM) 715. The storage 710 provides a large space for keeping static data where at least some instructions could be stored for later execution. The stored instructions may be further compiled to generate other representations of the instructions and dynamically stored in the RAM 715. The processor 705 reads instructions from the RAM 715 and performs actions as instructed. According to one embodiment of the invention, the computer system 700 further includes an output device 725 (e.g., a display) to provide at least some of the results of the execution as output including, but not limited to, visual information to users and an input device 730 to provide a user or another device with means for entering data and/or otherwise interact with the computer system 700. Each of these output 725 and input devices 730 could be joined by one or more additional peripherals to further expand the capabilities of the computer system 700. A network communicator 735 may be provided to connect the computer system 700 to a network 750 and in turn to other devices connected to the network 750 including other clients, servers, data stores, and interfaces, for instance. The modules of the computer system 700 are interconnected via a bus 745. Computer system 700 includes a data source interface 720 to access data source 760. The data source 760 can be access via one or more abstraction layers implemented in hardware or software. For example, the data source 760 may be access by network 750. In some embodiments the data source 760 may be accessed via an abstraction layer, such as, a semantic layer.

A data source 760 is an information resource. Data sources include sources of data that enable data storage and retrieval. Data sources may include databases, such as, relational, transactional, hierarchical, multi-dimensional (e.g., OLAP), object oriented databases, and the like. Further data sources include tabular data (e.g., spreadsheets, delimited text files), data tagged with a markup language (e.g., XML data), transactional data, unstructured data (e.g., text files, screen scrapings), hierarchical data (e.g., data in a file system, XML data), files, a plurality of reports, and any other data source accessible through an established protocol, such as, Open DataBase Connectivity (ODBC), produced by an underlying software system (e.g., ERP system), and the like. Data sources may also include a data source where the data is not tangibly stored or otherwise ephemeral such as data streams, broadcast data, and the like. These data sources can include associated data foundations, semantic layers, management systems, security systems and so on.

In the above description, numerous specific details are set forth to provide a thorough understanding of embodiments of the invention. One skilled in the relevant art will recognize, however that the invention can be practiced without one or more of the specific details or with other methods, components, techniques, etc. In other instances, well-known operations or structures are not shown or described in details to avoid obscuring aspects of the invention.

Although the processes illustrated and described herein include series of steps, it will be appreciated that the different embodiments of the present invention are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

The above descriptions and illustrations of embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. Rather, the scope of the invention is to be determined by the following claims, which are to be interpreted in accordance with established doctrines of claim construction.

What is claimed is:

1. A non-transitory computer readable storage medium to tangibly store instructions, which when executed by a computer, cause the computer to:

receive a context-aware event comprising an event and a context attached to the event, wherein the context comprises a structural description of an environment in which the event was generated, and wherein the structural description includes a combination of system parameters and application parameters of the environment;

retrieve the context attached to the event from the context-aware event;

reconstruct the context attached to the event to reconstruct the environment of the event in which the event was produced by retrieving the combination of the system parameters and the application parameters of the environment of the event;

provide context business information extracted from the reconstructed environment in a body part of an enriched event;

reconstruct at least a portion of the structural description of the context attached to the event;

provide the reconstructed at least one portion of the structural description of the context in the enriched event upon receiving a request from an event consumer; and reconstruct a second portion of the structural description of the context attached to the event, wherein the second portion includes additional system parameters and additional application parameters of the environment of the event.

2. The non-transitory computer readable storage medium of claim 1, wherein the context includes a structure of a set of context items, wherein a context item includes at least one item data.

3. The non-transitory computer readable storage medium of claim 2, wherein the set of context items represents a set of the system parameters, the application parameters, or the combination of the system parameters and the application parameters of the environment in which the event was generated.

4. The non-transitory computer readable storage medium of claim 2, further comprising instructions to cause the computer to: in response to reconstructing the context attached to the event, obtain the structure of the set of context items and the at least one item data.

5. The non-transitory computer readable storage medium of claim 1, further comprising instructions to cause the computer to deliver the enriched event to the event consumer.

6. The non-transitory computer readable storage medium of claim 1, further comprising instructions to cause the computer to:

form a group of a plurality of context-aware events that share a same context;

provide the group of the plurality of context-aware events that share the same context with detailed business information extracted from the same context; and deliver the group of the plurality of context-aware events to the event consumer.

7. A computerized method comprising:

receiving a context-aware event comprising an event and a context attached to the event, wherein the context comprises a structural description of an environment in which the event was generated, and wherein the structural description includes a combination of system parameters and application parameters of the environment;

retrieving the context attached to the event from the context-aware event;

reconstructing the context attached to the event to reconstruct the environment of the event in which the event was produced by retrieving the combination of the system parameters and the application parameters of the environment of the event;

providing context business information extracted from the reconstructed environment in a body part of an enriched event;

reconstructing at least a portion of the structural description of the context attached to the event;

providing the reconstructed at least one portion of the structural description of the context in the enriched event upon receiving a request from an event consumer; and reconstructing a second portion of the structural description of the context attached to the event, wherein the second portion includes additional system parameters and additional application parameters of the environment of the event.

8. The method of claim 7, wherein the context includes a structure of a set of context items, wherein a context item includes at least one item data.

9. The method of claim 8, wherein the set of context items represents a set of the system parameters, the application parameters, or the combination of the system parameters and the application parameters of the environment in which the event was generated.

10. The method of claim 8, further comprising: in response to reconstructing the context attached to the event, obtaining the structure of the set of context items and the at least one item data.

11. The method of claim 7, further comprising: delivering the enriched event to the event consumer.

12. The method of claim 7, further comprising:

forming a group of a plurality of context-aware events that share a same context;

providing the group of the plurality of context-aware events that share the same context with detailed business information extracted from the same context; and delivering the group of the plurality of context-aware events to the event consumer.

13. A system comprising:

a processor;

a memory in communication with the processor, the memory comprising:

an event consumption environment that receives a context-aware event that comprises an event and a context attached to the event, wherein the context comprises a structural description of an environment in which the event was generated; and wherein the structural description includes a combination of system parameters and application parameters of the environment;

at least one functional module in the event consumption environment that retrieves the context attached to the event from the context-aware event and reconstructs the context attached to the event to reconstruct the environment in which the event was generated by retrieving the combination of the system parameters and the application parameters of the environment of the event; and an event consumer application that receives an enriched event with context business information, in a body part of the enriched event extracted from the reconstructed environment;

at least a portion of the structural description of the context attached to the event reconstructed;

at least one portion of the structural description of the context in the enriched event provided upon receiving a request from an event consumer; and a second portion of the structural description of the context attached to the event reconstructed, wherein the second portion includes additional system parameters and additional application parameters of the environment of the event.

14. The system of claim 13, wherein the context includes a structure of a set of context items, wherein a context item includes at least one item data.

15. The system of claim 14, wherein the set of context items represents a set of the system parameters, the application parameters, or the combination of the system parameters and the application parameters of the environment in which the event was generated.

16. The system of claim 15, further comprising:

an event execution environment that extracts the context business information from the attached context to the event;

an event producer that produces the context-aware event based on the extracted context business information; and an event framework that receives the context-aware event from the event producer and sends it to the event consumption environment.

17. The system of claim 13, further comprising a plurality of context-aware events that share a common context grouped in a group, wherein the group is provided to the event consumer application with detailed business information extracted from the common context.

* * * * *